United States Patent [19]

Kitanishi

[11] Patent Number: 4,731,503

[45] Date of Patent: Mar. 15, 1988

[54] CONNECTOR WITH A FLEXIBLE CIRCUIT SUPPORT

[75] Inventor: Yoshitomo Kitanishi, Kashihara, Japan

[73] Assignee: Sharp Kabushiki Kaisha, Osaka, Japan

[21] Appl. No.: 845,341

[22] Filed: Mar. 28, 1986

Related U.S. Application Data

[63] Continuation of Ser. No. 501,975, Jun. 13, 1983, abandoned, which is a continuation of Ser. No. 234,870, Feb. 13, 1981, abandoned, which is a continuation of Ser. No. 926,088, Jul. 19, 1978, abandoned.

[30] Foreign Application Priority Data

Jul. 21, 1977 [JP]  Japan .................................. 52-88083
Aug. 31, 1977 [JP]  Japan ........................... 52-117416[U]

[51] Int. Cl.⁴ ............................................ H02G 15/08
[52] U.S. Cl. .............................. 174/88 R; 174/117 A; 174/117 FF; 439/492
[58] Field of Search ............. 174/88 R, 117 A, 117 F, 174/117 FF; 339/17 F, 28, 29 R, 176 MF; 252/511, 514; 29/829, 884, 885; 156/314, 901; 439/492

[56] References Cited

U.S. PATENT DOCUMENTS 4,113,981  9/1978  Fujita et al. ...................... 174/88 R
4,157,932  6/1979  Hirata ................................. 29/885

Primary Examiner—Arthur T. Grimley
Assistant Examiner—D. A. Tone
Attorney, Agent, or Firm—Birch, Stewart, Kolasch and Birch

[57] ABSTRACT

An electrically conducting hot melt adhesive is located at limited contact regions of a flexible circuit support, which typically carries a large scale integrated circuit (LSI) chip. A non-conducting hot melt adhesive is disposed between the limited contact regions at the non-contact regions. The resulting electrical connector can then be brought into contact with the corresponding areas of flexible or rigid circuit supports and through the application of heat and pressure, fuse the respective members so as to establish circuit paths between their limited contact regions via the electrically conducting hot melt adhesive. Heat and pressure are applied to the conducting hot melt adhesive in the same way as for an electrically non-conducting hot melt adhesive after contacting limited contact regions of another flexible circuit support or a rigid circuit support with the molten adhesive. Subsequently, the molten adhesive is left to cool so as to solidify. This results in establishing circuit paths between both the limited contact regions adhesively via the electrically conducting hot melt adhesive.

4 Claims, 10 Drawing Figures

CONNECTOR WITH A FLEXIBLE CIRCUIT SUPPORT

This application is a continuation of application Ser. No. 501,975, filed June 13, 1983 which was a continuation of Ser. No. 234,870, filed Feb. 13, 1981 which in turn was a continuation of U.S. Ser. No. 926,088, filed July 19, 1978, all of which are now abandoned.

BACKGROUND OF THE INVENTION

The present invention relates to a connector for establishing electric and mechanical connections between two circuit supports or between a circuit support and a component such as a display cell, and more particularly to a novel structure of a connector with a flexible circuit support.

There are two representative examples of the prior art connector for use with a flexible circuit support bearing a desired circuit wiring pattern.

1. A multi-pin connector is secured at one end of a flexible circuit support bearing a desired circuit wiring pattern and another circuit board whether flexible or rigid is plugged into the multi-pin connector, as seen from FIG. 1. In FIG. 1, a multi-pin connector plug 3 is provided at both ends or terminal regions of a flexible circuit support 1 bearing a desired circuit pattern 2. The connector plug 3 has a predetermined number of apertures for reception of a printed circuit board 5 with limited contact regions 6.

2. Both ends of circuit wiring leads are adapted to extend from the edges of a flexible circuit support, the extensions of these conducting leads being bonded directly to limited terminal regions of another support by soldering. This is illustrated in FIG. 2. In FIG. 2(a), a flexible circuit support 7 carries a predetermined number of conducting leads 8 which have extensions 9 and 10 at the both ends thereof extending beyond the edges 11 and 12 of the flexible circuit support 7. As viewed from a cross sectional view of FIG. 2(b), the extensions of the conducting leads are located into an aperture 14 formed in another circuit board 13 due to be connected to the flexible support 7 and soldered as denoted 15 to complete connections between the terminals 9 and 16.

Nevertheless, the first named type of connector is undesirable because it is voluminous, physically complicated and very expensive. In case of the second type of connector, a limit is placed upon the material of the flexible circuit support in addition to the laborious soldering process. In other words, only those materials which can tolerate a high temperature during the soldering process can be used, for example, polyimide and polyamide. It is difficult to find a flexible circuit support of comparatively low heat resistance.

It is therefore an object of the present invention to provide a novel connector which overcomes the problems with the prior art connectors. To achieve the above described object, an electrically conducting hot melt adhesive is interposed between a limited electrical contact region of a circuit pattern bearing a flexible circuit support and the counterpart of a circuit support or a component. By heating and subsequently cooling the electrically conducting hot melt adhesive the limited contact regions are adhesively bonded and connected together. To enhance the strength of the electrical and physical connections, it is preferable that an electically nonconducting hot melt adhesive be interposed at non-electrical contact regions not far from the electrical contact regions. Conventional hot melt adhesives will show electrical conductivity when containing conducting particles such as carbon distributed therethrough.

BRIEF DESCRIPTION OF THE DRAWINGS

Other objects and many of the attendant advantages of the present invention will become readily appreciated as the same becomes better understood by reference to the following detailed description considered in conjunction with the accompanying drawings in which like reference numerals designate like parts throughout the figures thereof, and which are given by way of illustration only and thus are not limitative of the present invention.

DETAILED DESCRIPTION OF THE INVENTION

As is well known, a hot melt adhesive is a sort of thermoplastic adhesive, which normally stands in the solid state and liquifies from the solid state through heat fusion. Subsequently, it is allowed to cool so as to solidify, offering good adhesion. The composition of the hot melt adhesive is 100% of solid-state material consisting of thermoplastic resin. While other sorts of adhesives solidify and adhere due to evaporation of a solvent or chemical reactions, the hot melt adhesive can solidify in several seconds to several tenths of a second after heating and subsequently cooling (without forced cooling) because it contains nothing but solid state material and not a solvent or water. The hot melt adhesive is therefore most desirable for high speed, large scale manufacturing and is applicable to a wide field of industry these days. In addition, the hot melt adhesive can adhere readily and securely to a wide variety of articles without being affected by the material and characteristic of the adhesion interface because it contains principally thermoplastic resin. By way of example, a commercially available hot melt adhesive contains chlorocrine resin, phenol resin, polyimide resin, polyamide resin, or polyester resin and normally shows no electrical conductivity. For the purpose of the present invention such metallic particles as carbon, gold, silver, and palladium are distributed through the above mentiond electrically nonconducting hot melt adhesive, affording the hot melt adhesive a desirable value of electrical conductivity. The electrically conducting metallic particle containing hot melt adhesive is interposed between limited electrical contact regions of two circuit supports due to be connected together. To ensure the strength of such electrical and physical connections, the nonconducting hot melt adhesive is interposed between non-electrical contact regions not far from the contact regions.

Figure 1:
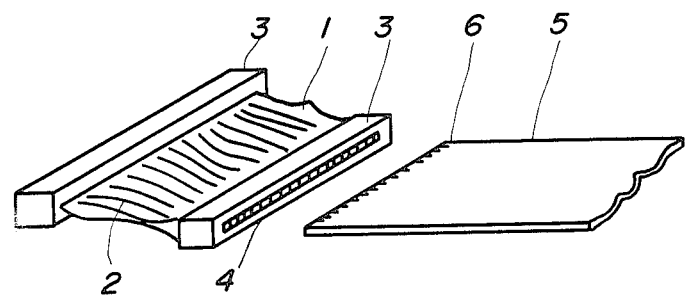
FIG. 1 is a prespective view of an example of the prior art connector.
Figure 2A:
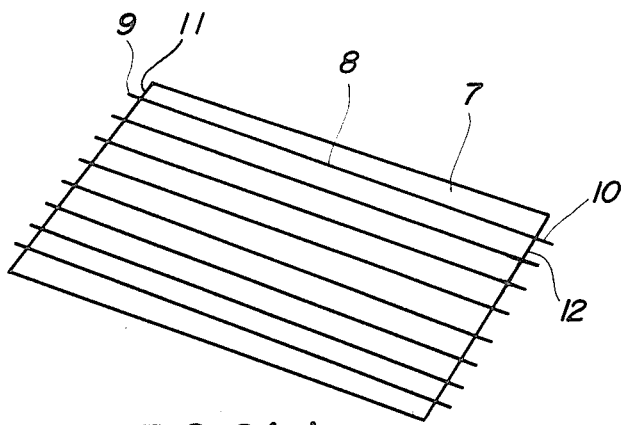
FIG. 2(a) and 2(b) are a perspective view and a cross sectional view respectively of another type of the prior art.
Figure 2B:
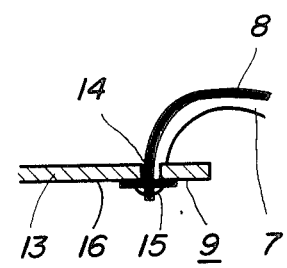
Figure 3:
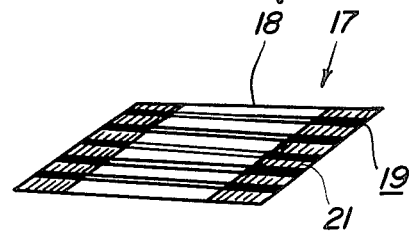
FIG. 3 is a perspective view of a connector embodying the present invention in its one preferred form.

FIG. 3 illustrates a connector embodying the present invention in one preferred form wherein a flexible film circuit support generally designated 17 bears a desired circuit wiring pattern. The metallic particle containing, electically conducting hot melt adhesive 19 is disposed on limited electrical contact regions of both edges of the film support 18, whereas the nonconducting hot melt adhesive 21 is disposed between the two adjacent limited non-electrical contact regions, namely, at the non-electrical contact regions. One way of disposing the hot melt adhesive is by screen printing. In the given example, the electrically nonconducting hot melt adhesive is first screen-printed and then the metallic particle containing adhesive is screen-printed.

Figure 4:
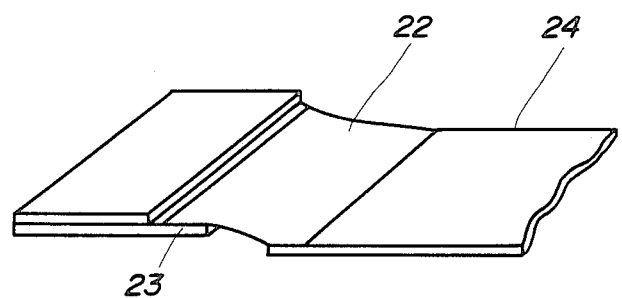
FIGS. 4 through 6 are perspective views of other preferred forms of the connector.

FIG. 4 is a perspective view of the condition where a liquid crystal display panel and a printed circuit support (flexible) are electrically and mechanically connected through the use of the connector of the present invention. In FIG. 4, 22 represents the connector embodying the present invention, 23 represents the liquid crystal display panel and 24 represents the printed circuit support or carrier. After accurate placement of the connector 22, with the liquid crystal display cell 23 and the printed circuit support 24, heat and pressure are applied so as to melt the hot melt adhesive. Subsequent cooling and solidifying of the hot melt adhesive completes the electrical and mechanical connections between the display cell 23 and the printed circuit support 24 via the hot melt adhesive.

In this instance, the step for applying heat and pressure requires an extremely brief period of time (like the soldering process) and at a temperature substantially lower than the soldering temperature, for example, 180° C. This implies that the connector of the present invention is applicable to not only excellent heat-proof film material but also comparatively low heat-proof film material. Economical film material is also available for the purpose of the present invention.

It does not matter if the surface of the adhesive is touched with a man's finger or the adhesive carrying connectors are stacked up. This is because the surface of the hot melt adhesive is not sticky when the adhesive is dried up after painting and heating. Even though the adhesive printing step and the heating step are spaced apart with respect to distance and time, the connector can be treated much more easily.

As noted earlier, it is possible to implement the connector of the present invention with the electrically conducting hot melt adhesive 19 painted on the film support 18 without employing the nonconducting hot melt adhesive. However, strength of the electrical and mechanical connections is not as good in this instance. As illustrated in the embodiment of FIG. 3, the electrically nonconducting hot melt adhesive 21 is provided at both sides of the electrically conducting hot melt adhesive 19 so as to increase the adhesion strength. This also leads to a substantial increase in terminal-to-terminal isolation resistance and in reliability of the adhesive connector.

Figure 5:
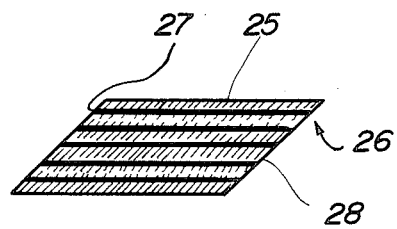

FIG. 5 is a perspective view of another preferred form of the present invention wherein an electrically conducting hot melt adhesive 27 is first disposed throughout a wiring pattern 26 on a flexible circuit support 25 and then overlaid in part (namely, non-contact regions) with a nonconducting hot melt adhesive 28. It is possible to form a predetermined number of the connectors on a longitudinal rolling film strip and separate each respective one of the connectors from the standpoint of a large scale manufacturing process. If only selected regions of the hot melt adhesive are subject to the thermal bonding process, the remaining regions thereof serve as a protective film for the wiring pattern.

Figure 6:
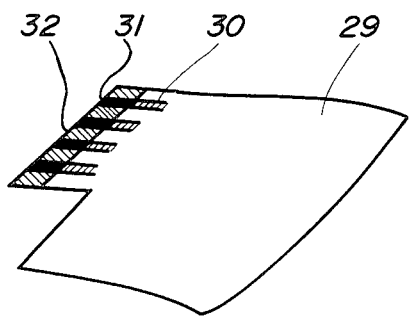

In FIG. 6, a portion of a flexible support carrying a circuit component, typically a large scale integrated circuit chip, has the function of the above mentioned connector. The embodiment of FIG. 6 includes a film circuit support 29, terminals 30, electrically conducting hot melt adhesives 31, and electrically nonconducting hot melt adhesives 32 disposed between the terminals. Electrical and mechanical connections are completed by the hot melt adhesives 31, 32.

Figure 7:
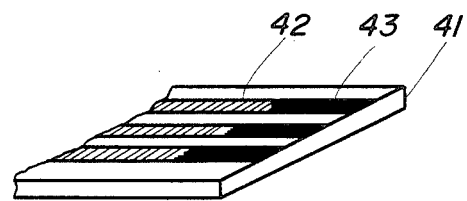
FIGS. 7 through 9 are perspective views and a cross sectional view of still another form of the connector.
Figure 8:
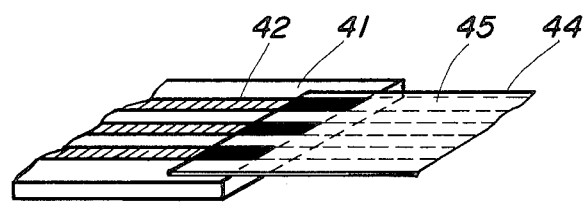
Figure 9:
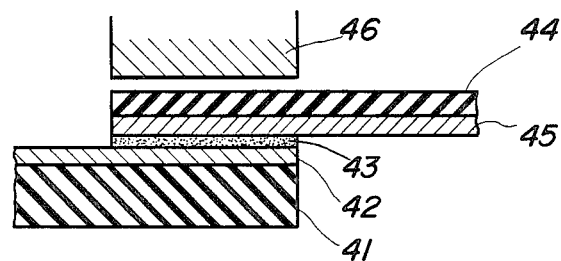

An alternative way of disposing the hot melt adhesive is suggested in FIGS. 7 through 9. On a rigid circuit support 41, a plurality of limited contact regions 42 (as marked in black) are overlaid with a hot melt adhesive 43 (for example, by screen printing). Subsequent to this, a flexible circuit support 44 is provided in such a way that limited contact regions 45 correspond in position to the counterpart of the rigid circuit support. Upon depression of a heating head the hot melt adhesive 43 is softened and then solidified to complete circuit connections.

The invention being thus described, it will be obvious the the same may be varied in many ways. Such modifications are not to be regarded as a departure from the spirit and scope of the invention, and all such modifications are intended to be included within the scope of the following claims.

What is claimed is:

1. An electrical connector configuration comprising:
   a pair of circuit supports each having a plurality of limited electrical contact regions and a plurality of limited non-electrical contact regions;
   an electrically conducting hot melt adhesive having electrically conductive particles dispersed therein interposed and solidified between said electrical contact regions of the supports, resulting in establishing circuit paths between said contact regions; and
   an electrically nonconducting hot melt adhesive free of electrically conductive particles interposed and solidified between said non-electrical contact regions of the supports for ensuring the strength of said adhesively established circuit paths.

2. An electrical connector configuration comprising:
   a flexible circuit support having a plurality of limited electrical contact regions and a plurality of limited non-electrical contact regions;
   a rigid circuit support having a plurality of limited electrical contact regions and a plurality of limited non-electrical contact regions;
   an electrically conducting hot melt adhesive having electrically conductive particles dispersed therein interposed and solidified between said electrical contact regions of said flexible circuit support and said rigid circuit support for establishing circuit paths between both said contact regions through said hot melt adhesive; and
   an electrically non-conductive hot melt adhesive free of electrically conductive particles interposed and solidified between said non-electrical contact regions of said flexible circuit and said rigid circuit support.

3. An electrical connector consisting of a flexible circuit support having alternately a plurality of limited electrical contact regions and a plurality of limited non-electrical contact regions, said limited electrical contact regions being coated with an electrically conducting hot melt adhesive having electrically conductive particles dispersed therein and said limited non-electrical contact regions being coated with a non-electrically conducting hot melt adhesive free of electrically conductive particles.

4. An electrical connector configuration consisting of a flexible circuit support having alternately a plurality of limited electrical contact regions and a plurality of limited non-electrical contact regions, said limited electrical contact regions being coated with an electrically conducting hot melt adhesive having electrically conductive particles dispersed therein and said limited non-electrical contact regions being coated with a non-electrically conducting hot melt adhesive free of electrically conductive particles, and a large scale integrated circuit chip mounted on and electrically connected to said flexible circuit support.

* * * * *